(12) United States Patent
Yoon et al.

(10) Patent No.: US 6,248,458 B1
(45) Date of Patent: Jun. 19, 2001

(54) ORGANIC ELECTROLUMINESCENT DEVICE WITH IMPROVED LONG-TERM STABILITY

(75) Inventors: Jong Geun Yoon, Seoul; Myung Seop Kim, Kyungki-do; Hyoung Yun Oh; Sung Tae Kim, both of Seoul, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/178,515

(22) Filed: Oct. 26, 1998

(30) Foreign Application Priority Data

Nov. 17, 1997 (KR) .................................. 97/60534
May 20, 1998 (KR) .................................. 98/18193
Sep. 9, 1998 (KR) .................................. 98/37215

(51) Int. Cl.⁷ .................................................. H05B 33/12
(52) U.S. Cl. .......................... 428/690; 428/704; 428/917; 313/504; 313/506
(58) Field of Search .................................. 428/690, 704, 428/917, 332, 336, 471; 313/504, 506, 509

(56) References Cited

U.S. PATENT DOCUMENTS

| | | | |
|---|---|---|---|
| 5,227,252 | * 7/1993 | Murayama et al. | 428/690 |
| 5,516,577 | * 5/1996 | Matsuura et al. | 428/212 |
| 5,593,788 | * 1/1997 | Shi et al. | 428/690 |
| 5,616,427 | * 4/1997 | Tada | 428/690 |
| 5,677,572 | * 10/1997 | Hung et al. | 257/750 |

* cited by examiner

Primary Examiner—Marie Yamnitzky
(74) Attorney, Agent, or Firm—Fleshner & Kim, LLP

(57) ABSTRACT

An organic electroluminescent device with improved long-term stability, comprising either a dual layer of a layer I and a layer II or a mixture of the two layers between an EL multilayer and a second electrode, the layer II being made of at least one alkali metal, alkaline earth metal, or compound thereof, the layer I being formed of at least one material selected from those having chemical formula I and chemical formula II as shown below.

CHEMICAL FORMULA I

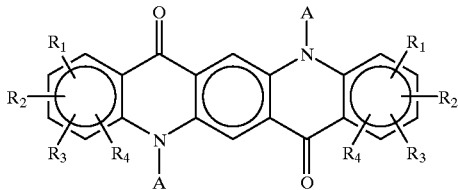

CHEMICAL FORMULA II

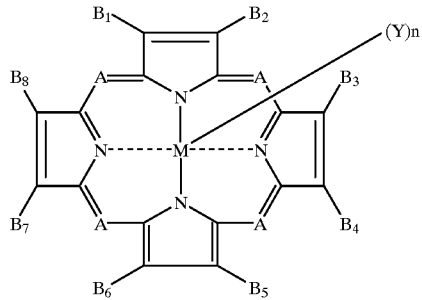

16 Claims, 1 Drawing Sheet

ORGANIC ELECTROLUMINESCENT DEVICE WITH IMPROVED LONG-TERM STABILITY

BACKGROUND OF THE INVENTION

1. Field of the Invention

The present invention relates to a display, and more particularly, to an organic electroluminescent (EL) device.

2. Background of the Related Art

Organic EL devices, also called organic light emitting diodes (LEDs), are becoming very popular because of their possible application to flat panel displays (FPDs). Organic EL devices are extremely thin, matrix-addressable and operable at a relatively low voltage, typically less than 15 volts. Furthermore, they have additional features suitable for next generation FPDs such as, among other things, little dependence on viewing angle and good device-formability on flexible substrates. Organic LEDs differ fundamentally from conventional inorganic LEDs. For Example, the charge transfer in inorganic LEDs is band-like in nature and the electron-hole recombination 15 results in the interband emission of light; while organic films are generally characterized by low-mobility activated hopping transport, and the emission is excitonic. Furthermore, organic EL devices are substantially different from conventional inorganic EL devices in other respects, notably in that in that organic EL devices are operable at low DC voltages.

Referring to FIG. 1, a typical organic EL device is shown with a first electrode 2 formed on a transparent substrate 1, a hole injecting layer (HIL) 3 and a hole transporting layer (HTL) 4 formed on the first electrode 2, a luminescent layer 5 formed on the HTL 4, an electron transporting layer (ETL) 6 and an electron injecting layer (EIL) 7 formed on the luminescent layer 5, and a second electrode 8 formed on the EIL 7. Any one or more of HIL 3, HTL 4, ETL 6 and EIL 7 may be omitted, depending on the particular device structure adopted.

Electrons and holes injected into the luminescent layer through the second electrode 8 and the first electrode 2, respectively, recombine to decay radiatively. For most organic EL devices, the charge injection barrier is higher for electrons than for holes. It is well known that the electron injection barrier may be lowered by employing a low work function material for the second electrode 8. However, low work function materials are chemically reactive, which makes it difficult to use such materials for electrodes. Accordingly, such materials are often used as a second electrode after being alloyed with one of more stable materials, as seen in the examples of Mg:Ag and Al:Li. However, such alloyed second electrodes are still less stable, more costly to form, and more difficult to deposit in a uniform film as compared to aluminum.

An even more serious problem often encountered with an alloyed second electrode of Mg:Ag or Al:Li is the frequent occurrence of cross talk or current leakage between pixels, which may be attributed to the diffusion of Mg or Li ions across organic layers of the device. This problem can be greatly alleviated if one selects aluminum as a second electrode material. However, in the case of aluminum there is a need to improve its poor electron injecting capability.

The electron injecting capability of a high work function second electrode, such as aluminum, can be significantly enhanced by inserting a very thin layer (typically 0.3 nm ~1.0 nm) of an electrically insulating material such as LiF, $MgF_2$ or $Li_2O$, inserted either between an aluminum electrode and the luminescent layer, or between the aluminum electrode and the ETL(see, for example, IEEE Transactions on Electronic Devices, Vol. 44, No. 8, p 1245–1248(1997), the contents of which are incorporated herein in their entirety).

$Li_2O$ is a particularly interesting material, in this regard, in that it is an electrically insulating material with a very low work function. The work function of alkali metals themselves is very low, and it becomes even lower when oxidized: for example, work function decreases from 2.1 eV for Cs to about 1 eV for $Cs_2O$. Various alkali metal compounds have reportedly been used to form an insulating buffer layer for the purpose of lowering the electron injecting barrier: e.g., $Li_2O$, $LiBO_2$, NaCl, KCl, $K_2SiO_3$, RbCl, and $Cs_2O$ to name a few. Despite this improvement, the introduction of the insulating buffer layer poses a challenging new problem, namely, deterioration of adhesion between an EL multilayer and aluminum, with consequent reduction of life time of the device. Experimental results reveal evidence of poor adhesion either at the buffer layer/aluminum interface or at the EL multilayer/buffer layer interface. This situation is not unexpected, given the different characteristics of materials involved. In summary, organic EL devices of the related art have at least two basic drawbacks, namely, poor adhesion and short life time.

The above references are incorporated by reference herein where appropriate for appropriate teachings of additional or alternative details, features and/or technical background.

SUMMARY OF THE INVENTION

Accordingly, the present invention is directed to an organic electroluminescent device that substantially obviates one or more of the problems, limitations and/or disadvantages of the related art.

An object of the present invention is to provide an organic EL device with a long life time and have high efficiency.

To achieve these and other advantages, and in accordance with the present invention as embodied and broadly described herein, the organic electroluminescent device comprises at least one organic EL multilayer disposed between a first electrode and a second electrode, and a layer I, disposed between the organic EL multilayer and the second electrode, including at least one first material from the group consisting of compounds of chemical formula I:

CHEMICAL FORMULA I

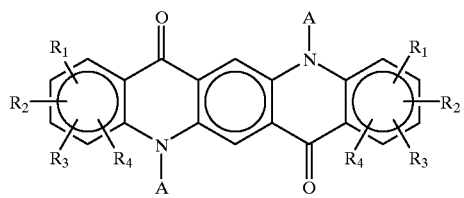

where:
    each of $R_1$ to $R_4$ is independently hydrogen, an alkyl or alkoxy group having from 1 to 5 carbon atoms, aryl, aryloxy or a halogen, or at least one among pairs of adjacent substituents of $R_1$ through $R_4$ may form an five or six- numbered conjugated cyclic ring which may includes carbon, nitrogen, or sulfur; and,
    A each independently denotes hydrogen, an alkyl group having from 1 to 5 carbon atoms, or aryl.

Herein, the term the organic EL multilayer may encompass a plurality of layers comprising a luminescent layer and typically one or more of the HIL, HTL, ETL, and EIL.

In a preferred form of the invention, said each of $R_1$ to $R_4$ is independently hydrogen, an alkyl and alkoxy group having from 1 to 5 carbon atoms, phenoxy, phenyl, naphtyl, fluorine, chlorine, or bromine, and said A each independently denotes methyl, ethyl, phenyl, or hydrogen.

In a highly preferred form of the invention, said $R_1$ is an alkyl and alkoxy group having from 1 to 5 carbon atoms, phenoxy, or phenyl, and said each of $R_2$ to $R_4$ and A is independently hydrogen.

In addition, the above-mentioned organic electroluminescent device may further comprises a layer II including at least one second material selected from the group consisting of an alkali metal, an alkaline earth metal, and a compound thereof, which may be disposed between the layer I and the second electrode. Preferably, said second electrode may comprise aluminum. Also, said layer II may comprise $Li_2O$. Said layer I may have a thickness of from about 0.5 nm to about 50 nm, and said layer II may have a thickness of from about 0.2 nm to about 3 nm.

According to another aspect of this invention, there is provided a means to improve the life time of an organic EL device, as well as the electron injecting capability, by inserting, instead of a dual layer of the layer I and the layer II, a mixed layer comprising a mixture of the components of layer I and layer II, wherein the mixed layer is inserted between the organic EL multilayer and the second electrode. The mixed layer is formed by the co-deposition of (1) at least one first material selected from the group consisting of compounds of chemical formula I and (2) at least one second material selected from the group consisting of an alkali metal, an alkaline earth metal, and a compound thereof The ratio between the first and second materials in the mixed layer can be either fixed or varied as a function of position, i.e., by forming a concentration gradient of the first and second material within the mixed layer. Preferably, said mixed layer may have a thickness of from about 0.5 nm to about 10 nm. Also, said second electrode comprises aluminum. Said second material may comprise $Li_2O$.

The present invention is also directed to an organic electroluminescent (EL) device comprising: at least one organic EL multilayer between a first electrode and a second electrode, and a layer I, disposed between the organic EL multilayer and the second electrode, including at least one first material selected from porphyrinic compounds. Herein, the term the organic EL multilayer may encompass a plurality of layers comprising a luminescent layer and typically one or more of the HIL, HTL, ETL, and EIL. The layer I includes at least one porphyrinic compound and serves principally to improve adhesion between the organic EL multilayer and the second electrode, while retaining good electron transporting capability.

Preferred porphyrinic compound according to the invention are those of the structural formula II as shown below.

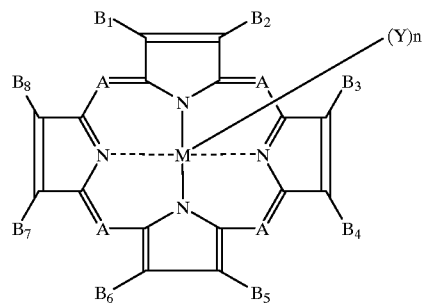

CHEMICAL FORMULA II where:

A each independently denotes —N= or —C(R)=, and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylamino, arylamino, an alkylphosphinic group, an arylphosphinic group, alkylsulfur or arylsulfur, or an element selected from groups VIA and VIIA ofthe periodic table;

n is an integer of 0, 1, or 2; and, $B_1$ through $B_8$ each independently represents hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyanyl, naphthyl, alkaryl, a halogen or a heterocyclic group, or at least one among pairs of adjacent substituents of $B_1$ through $B_8$ may form an unsaturated or saturated five, six, or seven-numbered ring which may include substituents such as alkyl, aryl, alkoxy, aryloxyalkyl, hydroxy, hydroxyalkyl, aralkyl, alkylamino, arylamino, nitroalkyl, alkylcarbonyl, alkoxycarbonyl, phenyl, amino, cyanyl, naphthyl, alkaryl, a halogen or a heterocyclic group. Preferred five, six or seven-numbered rings are those which include carbon, sulfur, oxygen or nitrogen ring atoms.

More highly preferred examples of useful porphyrinic compounds are phthalocyanines. Exemplary preferred materials are those of structural formulas III and IV as shown below:

CHEMICAL FORMULA III

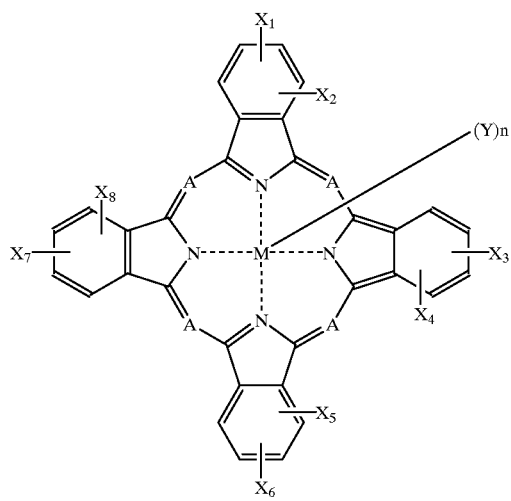

CHEMICAL FORMULA IV

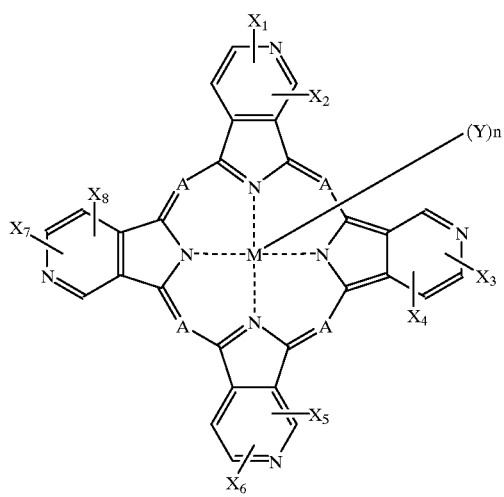

where:
A each independently denotes —N= or —C(R)=; and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylarnino, arylamino, an alkylphosphinic group, an arylphosphinic group, alkylsulfur, or arylsulfur, or an element selected from groups VIA and VIIA of the periodic table;

n is an integer of 0, 1, or 2; and, $X_1$ through $X_8$ each independently represent hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyanyl, naphthyl, alkaryl, a halogen or a heterocyclic group, or at least one among pairs of adjacent substituents of $X_1$ through $X_8$, may form an unsaturated or saturated five, six, or seven-numbered ring which may include substituents such as alkyl, aryl, alkoxy, aryloxyalkyl, hydroxy, hydroxyalkyl, aralkyl, akylamino, arylamino, nitroalkyl, alkylcarbonyl, alkoxycarbonyl, phenyl, amino, cyanyl, naphthyl, alkaryl, a halogen or a heterocyclic group. Preferred five, six or seven-numbered rings are those which include carbon, sulfur, oxygen or nitrogen ring atoms.

The most preferred examples of phthalocyanines are those of structural formulas V and VI as shown below:

CHEMICAL FORMULA V

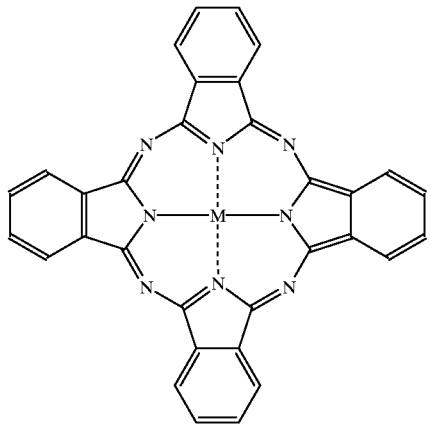

CHEMICAL FORMULA VI

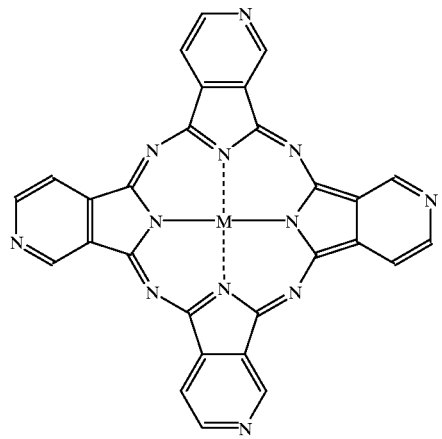

where:
M is one of Co, AlCl, Cu, 2Li, Fe, Pb, Mg, $SiCl_2$, 2Na, Sn, Zn, Ni, Mn, VO, 2Ag, MnCl, $SnCl_2$, and TiO.

In addition, the above-mentioned organic electroluminescent device may further comprise a layer II including at least one second material selected from the group consisting of an alkali metal, an alkaline earth metal, and a compound thereof According to another aspect of this invention, there is provided a means to improve the life time of an organic EL device, as well as the electron injecting capability, by inserting, instead of a dual layer of the layer I and the layer II, a mixed layer comprising a mixture of the components of layer I and layer II, wherein the mixed layer is inserted between the organic EL multilayer and the second electrode. The mixed layer is formed by the co-deposition of (1) at least one first material selected from the group consisting of compounds of chemical formula II and (2) at least one second material selected from the group consisting of an alkali metal, an alkaline earth metal, and a compound thereof The ratio of the first and second materials in the mixed layer can be either fixed or varied as a function of position, i.e., by forming a concentration gradient of the first and second materials within the mixed layer.

Additional advantages, objects, and features of the invention will be set forth in part in the description which follows and in part will become apparent to those having ordinary skill in the art upon examination of the following or may be learned from the practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Figure 1:
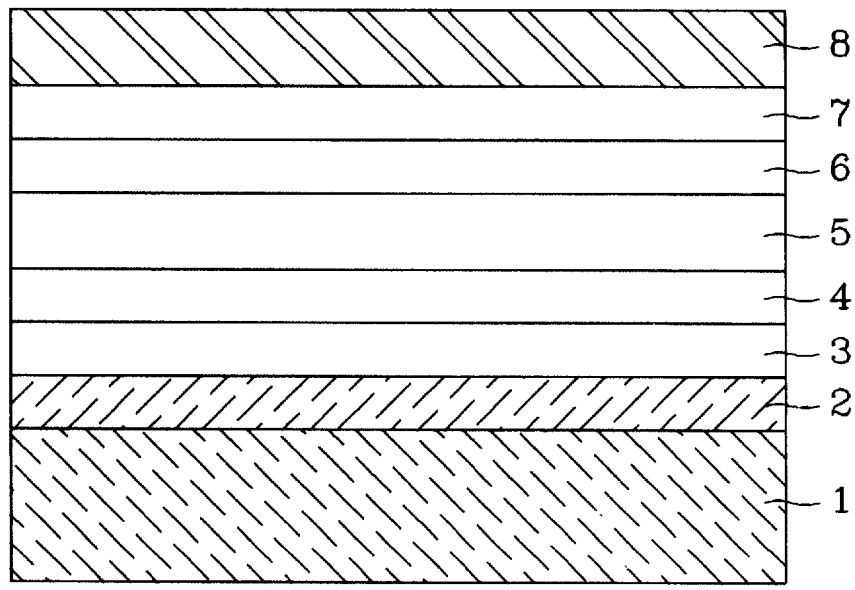
FIG. 1 illustrates a cross-sectional view of a related art organic EL device; and, FIG. 2 illustrates a cross-sectional view of an organic EL device in accordance with a preferred embodiment of the present invention.
Figure 2:
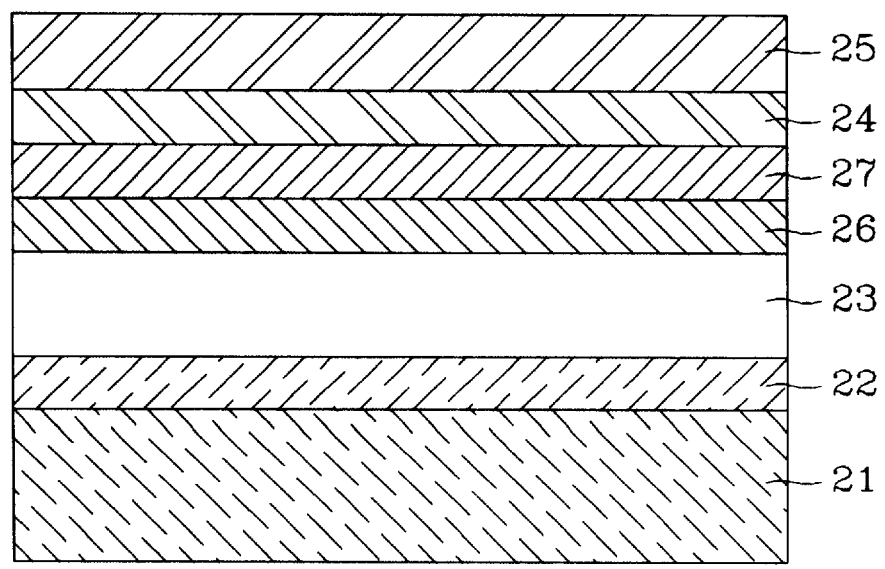

Referring to FIG. 2, the organic EL device in accordance with a preferred embodiment of the present invention includes a laminated structure of a transparent substrate 21, a first electrode 22, an organic EL multilayer 23 (which may comprise a HIL, a HTL, a luminescent layer, and an ETL), a second electrode 24, and a protection film 25. In addition, disposed between the organic EL multilayer 23 and the second electrode 24 are a layer I 26 and a layer II 27 which primarily serve for improving inter-layer adhesion and electron injection, respectively. The present invention may include only the layer I 26, or include both of the layer I 26 and the layer II 27. In a preferred embodiment of the invention, layer I comprises at least one first material from the group consisting of compounds of chemical formula I:

CHEMICAL FORMULA I

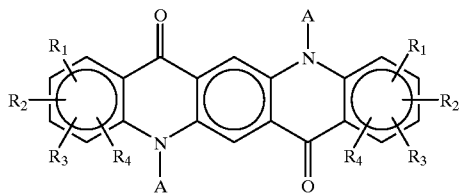

where:

each of $R_1$ to $R_4$ is independently hydrogen, an alkyl or alkoxy group having from 1 to 5 carbon atoms, aryl, aryloxy or a halogen, or at least one among pairs of adjacent substituents of $R_1$ through $R_4$ may form a five or six- numbered conjugated cyclic ring which may includes carbon, nitrogen, or sulfur; and, A each independently denotes hydrogen, an alkyl group having from 1 to 5 carbon atoms, or aryl.

Herein, the term the organic EL multilayer may encompass a plurality of layers comprising a luminescent layer and typically one or more of the HIL, HTL, ETL, and EIL.

Preferably, said each of $R_1$ to $R_4$ of chemical formula I is independently hydrogen, an alkyl and alkoxy group having from 1 to 5 carbon atoms, phenoxy, phenyl, naphthyl, fluorine, chlorine, or bromine, and said A each independently denotes methyl, ethyl, phenyl, or hydrogen, In a highly preferred form of the invention, said $R_1$ is an alkyl and alkoxy group having from 1 to 5 carbon atoms, phenoxy, or phenyl, and said each of $R_2$ to $R_4$ and A is independently hydrogen.

In addition, the above-mentioned organic electroluminescent device may further comprise a layer II, which may be disposed between the layer I and the second electrode. The layer II 27 is designed to improve the electron injection capability and comprises at least one material selected from the group consisting of an alkali metal, an alkaline earth metal, and a compound thereof Exemplary preferred materials comprising layer II 27 include Li, Cs, $Li_2O$, and LiF. The second electrode 24 is formed of a metal or its alloy, most preferably aluminum.

The organic EL device of the present invention having the layer I 26 and the layer II 27 thus stacked between the organic EL multilayer 23 and the second electrode 24 shows a substantially prolonged life time as well as a high luminance. The layer I 26 and the layer II 27 may be stacked in the opposite sequence to that shown in FIG. 2, which results in decreased luminance and life time. The layer I 26 and the layer II 27 may have a thickness of from about 0.5 nm to about 50 nm and from about 0.2 nm to about 3 nm, respectively.

According to another aspect of this invention, there is provided a means to improve the life time of an organic EL device, as well as the electron injecting capability, by inserting, instead of a dual layer of the layer I and the layer II, a mixed layer comprising a mixture of the components of layer I and layer II, wherein the mixed layer is inserted between the organic EL multilayer and the second electrode. The mixed layer is formed by the co-deposition of (1) at least one first material selected from the group consisting of compounds of chemical formula I and (2) at least one second material selected from the group consisting of an alkali metal, an alkaline earth metal and a compound thereof The ratio of the first and second materials in the mixed layer can be either fixed or varied as a function of position, i.e., by forming a concentration gradient of the first and second materials within the mixed layer.

Preferably, the mixed layer may have a thickness of from about 0.5 nm to about 10 nm.

Exemplary preferred materials comprising layer II 27 include Li, Cs, $Li_2O$, and LiF. The second electrode 24 is formed of a metal or its alloy, most preferably aluminum.

In addition, the layer I may comprises at least one porphyrinic compound and serves principally to improve the adhesion between the organic EL multilayer 23 and the second electrode 24, while retaining good electron transporting capability. Preferred porphyrinic compounds are those of structural formula II as shown below:

CHEMICAL FORMULA II

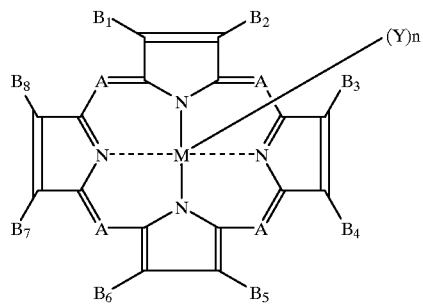

CHEMICAL FORMULA III

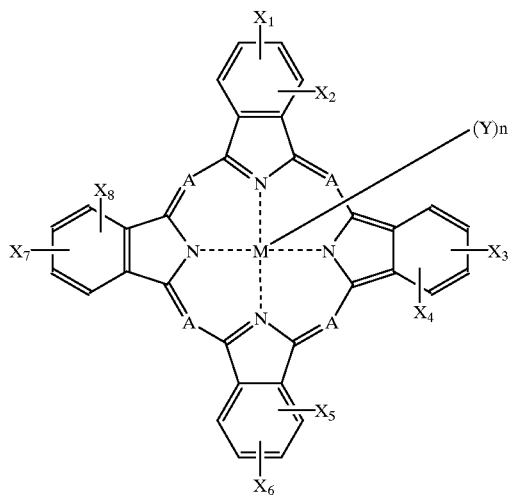

CHEMICAL FORMULA IV

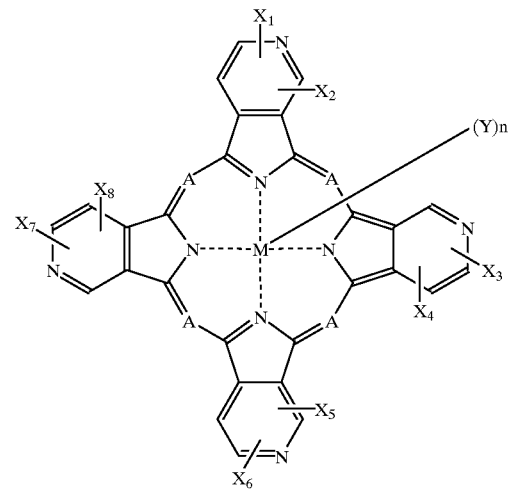

where:

A each independently denotes —N= or —C(R)=; and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylamino, arylamino, an alkylphosphinic group, an arylphosphnic group, alkylsulfur or arylsulfur, or an element selected from groups VIA and VIIA of the periodic table;

n is an integer of 0, 1, or 2; and, $B_1$ through $B_8$ each independently represent hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyanyl, naphthyl, alkaryl, a halogen or a heterocyclic group, or at least one among pairs of adjacent substituents of B1 through B8 may form an unsaturated or saturated five, six, or seven-numbered ring which may include substituents such as alkyl, aryl, alkoxy, aryloxyalkyl, hydroxy, hydroxyalkyl, aralkyl, alkylamino, arylamino, nitroalkyl, alkylcarbonyl, alkoxycarbonyl, phenyl, amino, cyanyl, naphthyl, alkaryl, a halogen, or a heterocyclic group. Preferred five, six, or seven-numbered rings are those which include carbon, sulfur, oxygen and nitrogen ring atoms.

More highly preferred examples of useful porphyrinic compounds are phthalocyanines. Exemplary preferred phthalocyanines are those of structural formulas III and IV as shown below:

where:

A each independently denotes —N= or —C(R)=; and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylamino, arylamino, an alkylphosphinic group, an arylphosphinic group, alkylsulfur, or arylsulfur or an element selected from groups VIA and VIIA of the periodic table;

n is an integer of 0, 1, or 2; and, $X_1$ through $X_8$ each independently represent hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyanyl, naphthyl, alkaryl, a halogen, or a heterocyclic group, or at least one among pairs of adjacent substituents of X1 through X8 may form an unsaturated or saturated five, six, or seven-numbered ring, which may include substituents such as alkyl, aryl, alkoxy, aryloxyalkyl, hydroxy, hydroxyalkyl, aralkyl, alkylamino, arylamino, nitroalkyl, alkylcarbonyl, alkoxycarbonyl, phenyl, amino, cyanyl, naphthyl, alkaryl, a halogen, or a heterocyclic group. Preferred five, six, or seven-numbered rings are those which include carbon, sulfur, oxygen or nitrogen ring atoms.

Preferably, M of chemical formulas II~IV is selected from the group consisting of 2Li, 2Na, Mg, Ti, V, Cr, Mn, Fe, Co, Ni, Pt, Cu, 2Ag, Zn, Al, Ga, In, Si, Sn, Pb, 2H, and TiO; and Y of chemical formulas II~IV is selected from the group consisting of oxygen, fluorine, chlorine, bromine, an alkoxy group (having alkyl moieties containing from about 1 to 10 carbon atoms), and a phenoxy group.

The most preferred examples of phthalocyanines are those of structural formulas V and VI as shown below:

CHEMICAL FORMULA V

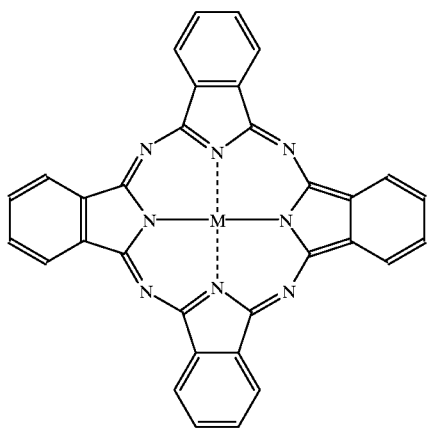

CHEMICAL FORMULA VI

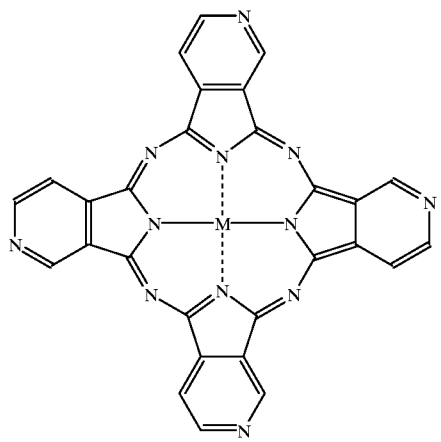

where:

M is selected from the group consisting of Co, AlCl, Cu, 2Li, Fe, Pb, Mg, SiCi$_2$, 2Na, Sn, Zn, Ni, Mn, VO, 2Ag, MnCl, SnCl$_2$ and TiO.

The layer II 27 is designed to improve the electron injection capability and comprises at least one material selected from the group consisting of an alkali metal, an alkaline earth metal, and a compound thereof Exemplary preferred materials comprising layer II 27 include Li, Cs, Li$_2$O, and LiF. The second electrode 24 is formed of a metal or its alloy, most preferably aluminum.

The organic EL device of the present invention having the layer I 26 and the layer II 27 thus stacked between the organic EL multilayer 23 and the second electrode 24 shows a substantially prolonged life time as well as a high luminance. The layer I 26 and the layer II 27 may be stacked in the opposite sequence to that shown in FIG. 2, which results in decreased luminance and life time. The layer I 26 and the layer II 27 may have a thickness of from about 0.5 nm to about 50 nm and from about 0.2 nm to about 3 nm, respectively.

Exemplary devices have been fabricated in accordance with the present invention, and their performance has been compared with that of background art devices: the two devices (A and B) are of the related art, and the other two devices (C and D) represent two embodiments of the present invention. The basic structure of a related art organic EL device for green emission comprises: (1) a first electrode of indium tin oxide (ITO) 150 nm thick, (2) a buffer layer of copper phthalocyanine (CuPc) typically 10 nm~20 nm thick, (3) a hole transporting layer of N,N'-diphenyl-N,N'-bis(3-methylphenyl)-(1,1'-biphenyl)-4,4'-diamine (TPD) typically 30 nm~50 nm thick, and (4) an emitting layer of tris(8-hydroxy-quinolate)aluminum (Alq$_3$) 40 nm~60 nm thick. The device A has a second electrode of aluminum formed directly on the organic EL multilayer (device structure: ITO/CuPc/TPD/Alq$_3$/Al); while the device B has a layer of Li$_2$O 1 nm thick between the organic EL multilayer and the second electrode (device structure: ITO/CuPc/TPD/Alq$_3$/Li$_2$O(1 nm)/Al). The device C has a structure of ITO/CuPc/TPD/Alq$_3$/CuPc(2 nm)/Li$_2$O(1 nm)/Al, while the device D has a structure of ITO/CuPc/TPD/Alq$_3$/Li$_2$O(1 nm)/CuPc(2 nm)/Al. In short, the layer-forming sequence of Li$_2$O(1 nm) and CuPc(2 nm) is reversed for the devices C and D. Finally, all devices have been encapsulated in an inert atmosphere.

TABLE I lists the voltage measured between a first electrode and a second electrode, luminance, and life time of the device, with each sample device subjected to a constant current density of 3 mA/cm$^2$.

TABLE I

| | voltage (V) | luminance (cd/m$^2$) | life time |
|---|---|---|---|
| Device A | 6 | 50 | short (less than 1 hour) |
| Device B | 6 | 100 | short (less than 1 hour) |
| Device C | 6 | 150 | long (longer than 2000 hours) |
| Device D | 8 | 130 | intermediate (roughly 100 hours) |

The life time quoted in TABLE I represents the time by which luminance drops to half the initial value for each device. It is apparent from TABLE 1 that the devices C and D of the present invention have superior long-term stability as compared with the devices A and B of the related art. This result may be explained as follows: $Li_2O$ shows poor adhesion to both $Alq_3$ and aluminum (e.g., device B). In addition, a 1 nm-thick layer of $Li_2O$ does not form a complete and uniform layer, but rather a type of island structure. As a result, in device C, a part of the CuPc layer is apparently in direct contact with aluminum through voids in the $Li_2O$ layer, which significantly contributes to enhancing the adhesion of the organic/metal interface and consequently the life time of the device, such as device C. The copper ion in CuPc is probably responsible for the relatively strong bonding between CuPc and aluminum. Compared to device C, device D exhibits a higher driving voltage because of the raised electron-injection barrier, due to the presence of CuPc between $Li_2O$ and aluminum, and consequently device D exhibits a shorter life time due to the increased electrical and thermal stress.

According to another embodiments of the invention, there is provided a means to improve the life time as well as the electron injecting capability of an organic EL device, by inserting, instead of a dual layer of the layer I 26 and the layer II 27 in FIG. 2, a mixed layer comprising layer I 26 and layer II 27 between the organic EL multilayer and the second electrode. The mixed layer is formed by the co-deposition of (1) a first material comprising at least one porphyrinic compound; and (2) a second material comprising at least one of an alkali metal, an alkaline earth metal, and a compound of thereof The use of the mixed layer improves adhesion, but deteriorates electron injection slightly. The mixing ratio between the two groups of materials can be fixed throughout the layer, or varied as a function of position (i.e., to form a concentration gradient of the components within the layer). According to a preferred embodiment, the mixed layer has a concentration gradient wherein: (1) the relative concentration of the second material comprising at least one of an alkali metal, an alkaline earth metal, and compounds thereof is zero at the interface with the EL multilayer, and unity at the interface with the second electrode, and varying gradually in between; and (2) the relative concentration of the first material comprising porphyrinic compounds in unity at the interface with the EL multilayer, and zero at the interface with the second electrode, and varying gradually in between. The thickness of the mixed layer is preferably in the range of from about 0.5 nm to about 10 nm.

Advantages of organic EL devices of the present invention include the following. The insertion of either a dual layer of layer I 26 and layer II 27, or a mixture of the two layers between the organic EL multilayer and the second electrode leads to significant improvements in the long-term stability as well as the luminance of an organic EL device wherein layer I 26 comprises at least one compound selected from the group consisting of those having chemical formula I and II, and layer II 27 comprises at least one of an alkali metal, an alkaline earth metal, and a compound thereof.

The foregoing embodiments are merely exemplary and are not to be construed as limiting the present invention. The present teaching can be easily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An organic electroluminescent (EL) device comprising: at least one organic EL multilayer between a first electrode and a second electrode, and a layer I including at least one first material from the group consisting of compounds of chemical formula I:

CHEMICAL FORMULA I

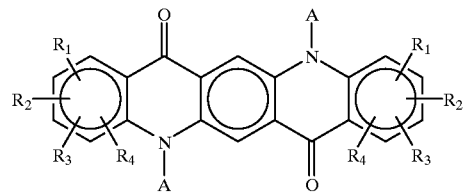

where:

each of $R_1$ to $R_4$ is independently hydrogen, an alkyl or alkoxy group having from 1 to 5 carbon atoms, aryl, aryloxy or a halogen, or at least one among pairs of adjacent substituents of $R_1$ through $R_4$ form an five or six-numbered conjugated cyclic ring; and, A each independently denotes hydrogen, an alkyl group having from 1 to 5 carbon atoms, or aryl;

and layer I including at least one second material comprising $Li_2O$.

2. The device as claimed in claim 1, wherein at least one among pairs of adjacent substituents of $R_1$ through $R_4$ form a five or six-numbered conjugated cyclic ring and wherein said five or six-numbered conjugated cyclic ring includes carbon, nitrogen, or sulfur.

3. The device as claimed in claim 1, wherein said each of $R_1$ to $R_4$ is independently hydrogen, an alkyl or alkoxy group having from 1 to 5 carbon atoms, phenoxy, phenyl, naphthyl, fluorine, chlorine, or bromine, and said A each independently denotes methyl, ethyl, phenyl, or hydrogen.

4. The device as claimed in claim 1, wherein said $R_1$ is an alkyl or alkoxy group having from 1 to 5 carbon atoms, phenoxy or phenyl, and said each of $R_2$ to $R_4$ and A is independently hydrogen.

5. The device as claimed in claim 1, wherein said second electrode comprises aluminum.

6. An organic electroluminescent (EL) device comprising: as least one organic EL multilayer between a first electrode and a second electrode, and a layer I including at least one first material selected from porphyrinic compounds and at least one second material comprising $Li_2O$.

7. The device as claimed in claim 6, wherein said at least one first material has the following structure:

CHEMICAL FORMULA II

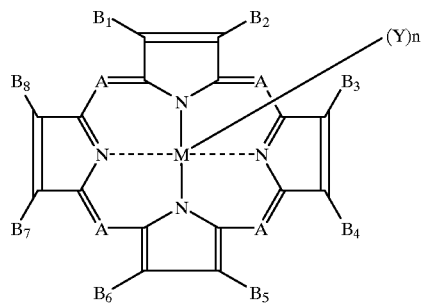

where:

A each independently denotes —N= or —C(R)=, and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylamino, arylamino, an alkylphosphinic group, an arylphosphinic group, alkylsulfur or arylsulfur, or an element selected from groups VIA and VIIA of the periodic table;

n is an integer of 0, 1, or 2; and, $B_1$ through $B_8$ each independently represents hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyano, naphthyl, alkaryl, a halogen or a heterocyclic group, or at least one among pairs of adjacent substituents of $B_1$ through $B_8$ form an unsaturated or saturated five, six, or seven-numbered ring.

8. The device as claimed in claim 7, wherein said at least one first material comprises a compound selected from the group represented by chemical formulas III and IV as shown below:

CHEMICAL FORMULA III

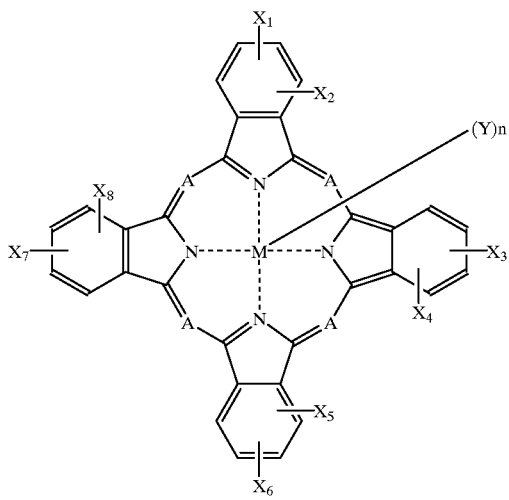

CHEMICAL FORMULA IV

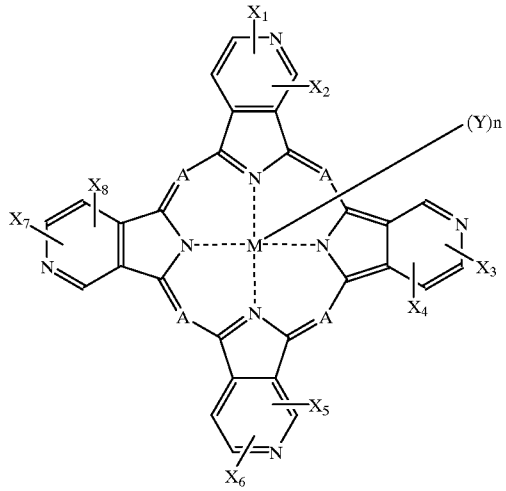

where:

A each independently denotes —N= or —C(R)=; and R is hydrogen, alkyl, alkoxy, aralkyl, alkaryl, aryl, or a heterocyclic group;

M comprises an element selected from groups IA, IIA, IIIA and IVA, and the third, fourth, fifth and sixth periods of the periodic table;

Y is alkoxy, phenoxy, alkylamino, arylamino, an alkylphosphinic group, an arylphosphinic group, alkylsulfur or arylsulfur, or an element selected from groups VIA and VIIA of the periodic table;

n is an integer of 0, 1, or 2; and, $X_1$ through $X_8$ each independently represent hydrogen, alkyl, aryl, alkoxy, aryloxyalkyl, hydroxy, hydroxyalkyl, aralkyl, alkylamino, arylamino, alkylthiol, arylthiol, nitroalkyl, alkylcarbonyl, alkoxycarbonyl, phenyl, amino, cyano, naphthyl, alkaryl, a halogen or a heterocyclic group, or at least one among pairs of adjacent substituents of $X_1$ through $X_8$ form an unsaturated or saturated five, six, or seven-numbered ring.

9. The device as claimed in claim 8, wherein said at least one first material comprises a compound selected from the group represented by chemical formulas V and VI as shown below:

CHEMICAL FORMULA V

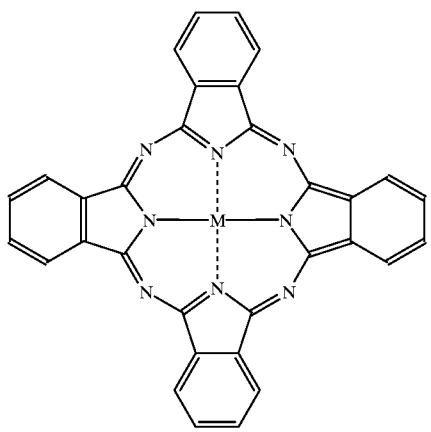

CHEMICAL FORMULA VI

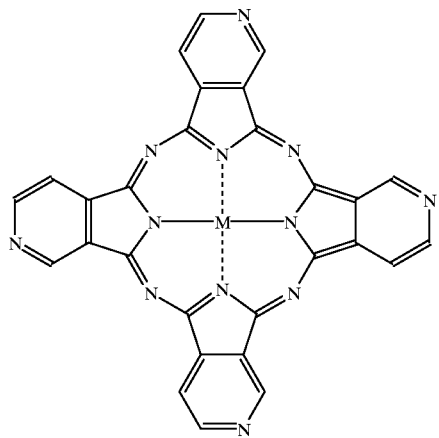

where:
M is one of Co, AlCl, Cu, 2Li, Fe, Pb, Mg, SiCl$_2$, 2Na, Sn, Zn, Ni, Mn, VO, 2Ag, MnCl, SnCl$_2$, and TiO.

10. The device as claimed in claim 8, wherein said M of chemical formula III and IV is one of 2Li, 2Na, Mg, Ca, Ti, V, Cr, Mn, Fe, Co, Ni, Pt, Cu, 2Ag, Zn, Pd, Al, Ga, In, Si, Sn, Pb, 2H, and TiO.

11. The device as claimed in claim 8, wherein said Y of chemical formula III and IV is present and said Y of chemical formula III and IV is one of oxygen, fluorine, chlorine, bromine, an alkoxy group having from 1 to 10 carbon atoms, and phenoxy.

12. The device as claimed in claim 7, wherein at least one among pairs of adjacent substituents of $B_1$ through $B_8$ form an unsaturated or saturated five, six, or seven-numbered ring and said unsaturated or saturated five, six, or seven-numbered ring includes carbon, nitrogen, sulfur or oxygen.

13. The device as claimed in claim 7, wherein at least one among pairs of adjacent substituents of $B_1$ through $B_8$ form an unsaturated or saturated five, six, or seven-numbered ring and said unsaturated or saturated five, six, or seven-numbered ring includes substituents selected from alkyl, aryl, alkoxy, aryloxyalkyl, hydroxy, hydroxyalkyl, aralkyl, alkylamino, arylamino, nitroalkyl, alkylcarbonyl, alkoxycarbonyl, phenyl, amino, cyano naphthyl, alkaryl, a halogen, or a heterocyclic group.

14. The device as claimed in claim 7, wherein said M of chemical formula II is one of 2Li, 2Na, Mg, Ca, Ti, V, Cr, Mn, Fe, Co, Ni, Pt, Cu, 2Ag, Zn, Pd, Al, Ga, In, Si, Sn, Pb, 2H, and TiO.

15. The device as claimed in claim 7, wherein said Y of chemical formula II is present and said Y of chemical formula II is one of oxygen, fluorine, chlorine, bromine, an alkoxy group having from 1 to 10 carbon atoms, and phenoxy.

16. The device as claimed in claim 6, wherein said second electrode comprises aluminum.

* * * * *